United States Patent [19]

Douglas et al.

[11] Patent Number: 5,118,968
[45] Date of Patent: Jun. 2, 1992

[54] SPECIAL MODE ACTIVATION CIRCUIT FOR SELECTIVELY ACTIVATING A SPECIAL MODE CIRCUIT OF A SEMICONDUCTOR INTEGRATED CIRCUIT DEVICE

[75] Inventors: Kurt P. Douglas; Wen-Foo Chern; Vijaya B. Wickremarachchi, all of Boise, Id.

[73] Assignee: Micron Technology, Inc., Boise, Id.

[21] Appl. No.: 581,587

[22] Filed: Sep. 12, 1990

[51] Int. Cl.⁵ ............................................. H03K 5/153
[52] U.S. Cl. ................................. 307/362; 307/360; 307/361; 307/363
[58] Field of Search ................ 307/362, 363, 360, 361

[56] References Cited

U.S. PATENT DOCUMENTS

| | | | |
|---|---|---|---|
| 4,709,165 | 11/1987 | Higuchi | 307/362 |
| 4,825,018 | 4/1989 | Okuda | 307/362 |
| 4,873,458 | 10/1989 | Yoshida | 307/362 |
| 4,922,133 | 5/1990 | Iwahashi | 307/362 |

Primary Examiner—Eugene R. LaRoche
Assistant Examiner—R. A. Ratliff
Attorney, Agent, or Firm—Wells, St. John & Roberts

[57] ABSTRACT

A special mode activation circuit is disclosed for activating a special mode circuit within a semiconductor integrated circuit when the voltage of an input signal at an input terminal of the integrated circuit reaches a special high voltage level that is substantially above a low voltage level range of signals normally associated with binary logic levels. The special mode activation circuit comprises a voltage reduction subcircuit, a voltage detection subcircuit, and an active pullup subcircuit. The voltage reduction subcircuit reduces the voltage of the input signal to generate a reduced voltage input signal. The voltage detection subcircuit is responsive to the reduced voltage signal to prevent activation of the special mode circuit when the reduced voltage input signal is less than a preset threshold value and to activate the special mode circuit when reduced voltage input signal exceeds the preset threshold value. The active pullup subcircuit maintains the voltage of the reduced voltage input signal above a minimum voltage to (1) prevent leakage current through the voltage reduction subcircuit, (2) reduce the voltage change required in the reduced voltage input signal to activate the special mode circuit, and (3) reduce the possibility of induced latchup.

17 Claims, 3 Drawing Sheets

# SPECIAL MODE ACTIVATION CIRCUIT FOR SELECTIVELY ACTIVATING A SPECIAL MODE CIRCUIT OF A SEMICONDUCTOR INTEGRATED CIRCUIT DEVICE

TECHNICAL FIELD

This invention relates a semiconductor CMOS integrated circuit device having both an operational circuit and a special mode circuit therein that are both connected to a common terminal and more particularly to a special mode activating circuit for activating the special mode circuit upon the application of a special high voltage level signal at the common terminal.

BACKGROUND OF THE INVENTION

Input terminals of conventional digital circuits are designed to normally receive a relatively low voltage level range of input signals of less than seven volts to indicate binary logic values of "1" and "0" or "high" and "low". The low voltage level input signals normally range from −1.0 volts to 6.5 volts in typical complementary metal oxide semiconductor (CMOS) integrated circuits.

Because the number of terminal pins on an integrated circuit is limited, it is sometimes desirable to connect a common or single terminal to be different circuits, particularly if the two circuits are intended to be operated during different time intervals. The activation of the less used or special circuit is frequently accomplished by the application of a high voltage level signal significantly above the low voltage level. The special high voltage level, referred to herein as $V_{act}$, is used to activate the special mode circuit within the device. For example, CMOS random access memory integrated circuit devices have special test mode circuits combined on the device for testing the memory circuit. The special test mode circuits can be activated by presenting the special high voltage level on an input pin normally used for transmitting data to the memory circuit. The special high voltage level is significantly greater than the low voltage level normally associated with "high" and "low" binary logic values within the circuit and should not be confused with the "high" voltage which corresponds to a logic "1". The special high voltage typically ranges from 10 to 25 volts, depending on the particular circuit in which it is used.

FIG. 1 shows a typical arrangement of a CMOS semiconductor integrated circuit device 10 including an input terminal 12 that is intended to receive both a low voltage level signal and a special high voltage level signal. Operational circuits 18, within integrated circuit device 10, normally operate on low voltage level signals. Operational circuits 18 are connected to input terminal 12 through input line 22 and are adapted to receive normal low voltage level binary logic signals from input terminal 12. One of the operational circuits 18 is identified as a special mode circuit 20 because it, when activated, initiates a special mode or function, such as a test mode.

In integrated circuits using metal oxide semiconductor field effect transistor (MOSFET) technology, input terminals are usually connected to the gate of a MOSFET. While such a gate is typically capable of withstanding a special high voltage level signal, it is incapable, under normal biasing levels, of distinguishing between low level signals used for binary logic state transfer ("1" and "0") and a special high voltage level signal used to activate a special mode circuit. Therefore, a special activation circuit is required to detect a special high voltage level signal and to activate the special mode circuit only when such a high voltage level signal is applied to the input terminal.

Accordingly, integrated circuit 10 includes a special mode activation circuit 14 for detecting a special high voltage level signal and for activating special mode circuit 20 when such a signal is present at input terminal 12. Special mode activation circuit 14 is connected directly to input terminal 12 through input line 22, and activates the special mode circuit 20 through activation line 24.

In operation, special mode activation circuit 14 maintains the special mode circuit 20 deactivated when the input terminal is at the low voltage level normally associated with binary logic values processed by operational circuits 18. Special mode activation circuit 14 activates special mode circuit 20 only when the input signal is changed to the special high voltage level.

Ideally, special mode activation circuit 14 should have no electrical effect on input line 22; i.e., it should present a very high impedance at its input. In addition, the voltage required at input terminal 12 to activate special mode circuit 20 ($V_{act}$) should be significantly above the low voltage level normally associated with binary logic values, and should be constant regardless of semiconductor process variations.

FIG. 2 shows a prior art special mode activation circuit 40. Circuit 40 comprises a p-channel MOSFET 42 and an n-channel MOSFET 44. The gates of transistors 42 and 44 are connected together and to a positive reference voltage, $V_{dd}$. The drains of transistors 42 and 44 are connected together to the input of a voltage inverter 46. The output of voltage inverter 46 is connected through activation line 24 to the special mode circuit 20 (FIG. 1). The source of transistor 14 is connected to a negative reference voltage, $V_{ss}$, or ground, and the source of transistor 42 is connected to input terminal 12 (FIG. 1) through input line 22. The voltage at input line 22 is referred to as $V_{in}$ for convenience.

Transistor 44, with its gate connected to $V_{dd}$ and its source connected to ground, will conduct at all times, pulling the input of inverter 46 low. However, p-channel transistor 42 will also begin to conduct when $V_{in}$ exceeds $V_{dd}$ by more than the threshold voltage $V_T$ of transistor 42.

The operational and dimensional parameters of transistors 42 and 44 can be selected for differing responses to $V_{in}$. For instance, transistor 44 can be made much smaller than transistor 42, with a resulting relatively low conductance. In this case, transistor 44 will weakly pull the input of inverter 46 to ground. When transistor 42 begins to conduct, it will quickly, due to its greater conductance, pull the input of inverter 46 to $V_{in}$. Thus, the input of inverter 46 will be abruptly changed from a low to a high as $V_{in}$ exceeds $V_{dd}+V_T$, and inverter 46 will, as a result, activate special mode circuit 20.

If, on the other hand, transistors 42 and 44 are constructed to have more nearly equal conductances, they will act as a voltage divider as transistor 42 begins to conduct. Thus, the input of inverter 46 will change gradually from a low to a high, eventually reaching a threshold at which inverter 46 will switch its output, activation line 24, to activate the special mode circuit 20.

Unfortunately, special mode activation circuit 40 does not always present a high impedance to input line 22. Specifically, circuit 40 requires current from input terminal 12 whenever $V_{in}$ exceeds $V_{dd}+V_T$. In addition, the voltage at which special mode circuit 20 will be activated will vary unpredictably by several volts depending on the supply voltage of inverter 46. This is because the threshold at which inverter 46 will switch its output to activate special mode circuit 20 will vary within wide limits as the supply voltage of inverter 46 changes. A further problem with the circuit of FIG. 2 is that, regardless of trnsistor sizes, circuit 40 is particularly susceptible to latchup if $V_{in}$ rises quickly from a low voltage level signal to the special high voltage level signal. Latchup is a common and well-known problem in CMOS circuits.

Another prior art special mode activation circuit 50 is shown in FIG. 2 that comprises a series of n-channel MOSFETs 52, connected to function as diodes, an n-channel MOSFET 54, and a voltage inverter 56. Each of diode-connected transistors 52 has its gate connected to its drain so that it will conduct only when the voltage of the drain with respect to the source exceeds the threshold voltage $V_T$ of such transistor 52. Each transistor 52 thus functions as a diode, preventing reverse current and dropping an incremental voltage equal to $V_T$. Transistors 52 are connected in series, with the gate and drain of the first transistor 52 connected to $V_{in}$ and the source of the last transistor 52 connected to the drain of transistor 24 and to the input of inverter 56. The output of inverter 56 is connected through activation line 24 to special mode circuit 20 (FIG. 1).

Transistor 54 is coupled between the input of inverter 56 and ground to normally hold the input of the inverter "low." The transistor has a gate connected to $V_{dd}$ and a source connected to a negative reference voltage, $V_{ss}$, or ground. However, the structural and electrical parameters of transistor 54 are selected to provide a relatively low conductance. Therefore, transistor 54 functions much like a resistor, weakly pulling the input of inverter 56 to ground.

In operation, if $V_{in}$ is less than the combined threshold voltages $V_T$ of transistors 52, it will not be conducted to the input of inverter 56. Thus, in effect, a constant voltage is subtracted from $V_{in}$, depending on the number of diode-connected transistors 52. Weak transistor 54 has little effect on the voltage at the input of inverter 56 once transistors 22 begin conducting and a reduced voltage (with respect to $V_{in}$) is therefore presented to the input of inverter 56. Inverter 56 will switch activation line 24 to activate special mode circuit 20 as its input reaches the inverter threshold.

Again, however, circuit 50 does not present a high impedance to input line 22. Special mode activation circuit 50 requires current from input line 22 whenever $V_{in}$ exceeds the combined threshold voltages of transistors 52, regardless of whether $V_{in}$ has exceeded the voltage required to actually activate special mode circuit 20. Also, like special mode activation circuit 40 of FIG. 2, the inverter threshold is unpredictably dependent upon the supply voltage.

Accordingly, a need remains for a special mode activation circuit which may be used in CMOS integrated circuits to activate a special mode circuit when the voltage at an input terminal exceeds an arbitrarily selected value. Such a circuit should require little or no current from the input terminal until the special high voltage level is reached, should be insensitive to process variations, and should be reasonably immune from induced CMOS latchup.

BRIEF DESCRIPTION OF THE DRAWINGS

The preferred embodiment of the invention is illustrated in the accompanying drawings, in which.

DETAILED DESCRIPTION OF THE PREFERRED EMBODIMENTS

The following disclosure of the invention is submitted in furtherance with the constitutional purpose of the Patent Laws "to promote the progress of science and useful arts" (Article 1, Section 8).

Figure 4:
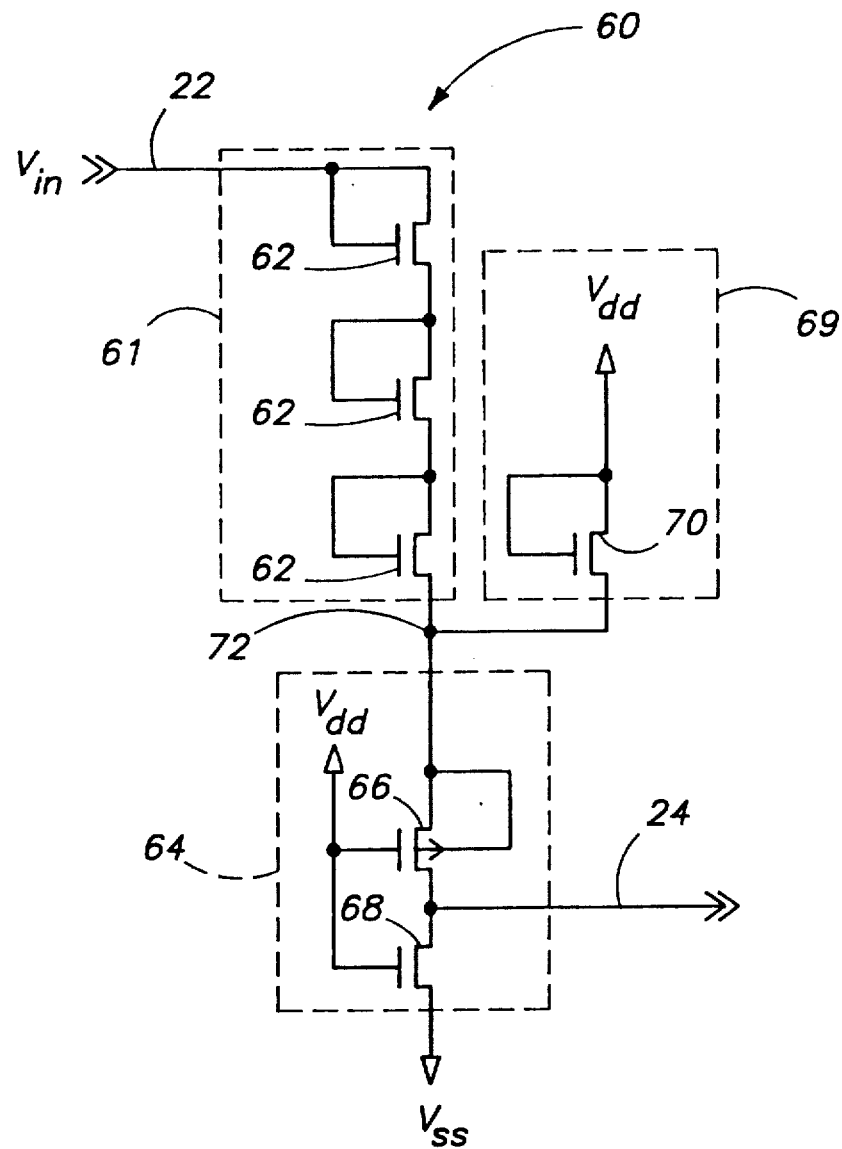
FIG. 4 is an electrical schematic diagram of a preferred embodiment of a special mode activation circuit according to this invention.

FIG. 4 illustrates a preferred embodiment of a special mode activation circuit 60 in accordance with this invention. Circuit 60 includes a voltage reduction subcircuit 61, a voltage detection subcircuit 64, and an active pullup subcircuit 69.

Voltage reduction subcircuit 61 is electrically connected to input line 22 for reducing the voltage $V_{in}$ of an input signal at input line 22 by a preset voltage value, thus generating a reduced voltage input signal 72 which is equal to $V_{in}$ minus the preset voltage value.

Figure 1:
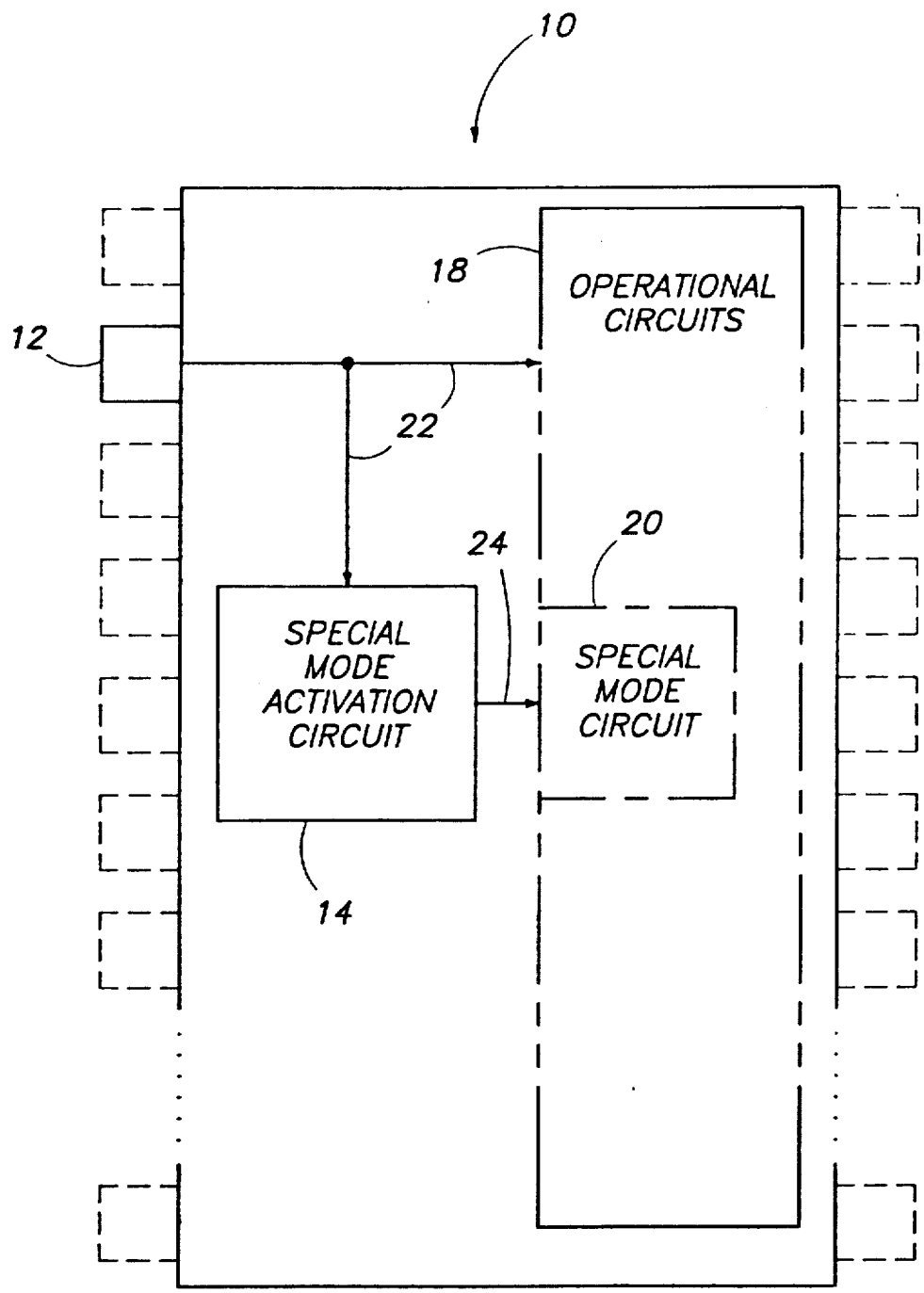
FIG. 1 is a block diagram of a CMOS integrated circuit device including a special mode activation circuit.

Voltage detection subcircuit 64 is operatively connected through an activation line 24 to special mode circuit 20 (FIG. 1) and is responsive to reduced voltage input signal 72. Subcircuit 64 prevents activation of special mode circuit 20 when reduced voltage input signal 72 is less than a preset threshold value and activates special mode circuit 20 when reduced voltage input signal 72 exceeds the preset threshold value.

In operation, then, $V_{in}$ must exceed the sum of the present voltage value and the preset threshold value before special mode circuit 20 will be activated. This sum, therefore, equals the special high voltage level $V_{act}$ and is set at a value substantially greater than the low voltage level normally associated with binary logic values.

More specifically, voltage reduction subcircuit 61 comprises a plurality of diode voltage reduction means for generating the reduced voltage input signal 72 and for preventing reverse current therethrough. Each diode voltage reduction means comprises a MOSFET transistor 62 having a source, a drain, and a gate, wherein the drain and gate are connected in common. Each transistor therefore acts as a diode, preventing reverse current from the source to the drain and allowing forward current from the drain to the source only when the drain has a voltage with respect to the source which exceeds the transistor threshold voltage $V_T$. Transistors 62 are connected in series, drain to source, with the first transistor 62 having its drain connected to input line 22 and the last transistor 62 producing the reduced voltage input signal 72 at its source.

MOSFET transistors 62 thus reduce the voltage of an input signal at input line 22 by each dropping an incremental amount of voltage equal to $V_T$. While three transistors are shown, more may be added to obtain the preset voltage value. Thus, voltage reduction subcircuit 61 drops a preset voltage value equal to $(n)V_T$ from the input signal, where n is the number of transistors 62 connected in series. Typical MOSFETs have threshold voltages ($V_T$) which range from 0.3 volts to over 1.0 volts.

Voltage detection subcircuit 64 comprises first and second MOSFETs 66 and 68. Transistor 68 is an n-channel device with its source connected to a negative reference, $V_{ss}$, or ground. Transistor 66 is a p-channel device with its source and n-well substrate connected to reduced voltage input signal 72. Transistors 66 and 68 each have gates connected to a positive reference voltage $V_{dd}$, and drains connected in common and through activation line 24 to special mode circuit 20.

Transistor 68, with its gate connected to $V_{dd}$ and its source connected to ground, will conduct at all times, pulling activation line 24 low. However, transistor 68 is sized to provide a relatively low conductance as compared with transistor 66. Transistor 66 will begin to conduct when the voltage at its source, or at reduced voltage signal 72, exceeds $V_{dd}$ plus the threshold voltage of transistor 66. Because of its relatively high conductance, transistor 66 will abruptly pull activation line 24 high, activating special mode circuit 20. Thus, voltage detection subcircuit 64 will activate special mode circuit 20 when reduced voltage input signal 72 exceeds the preset threshold value, equal to $V_{dd}+V_T$.

$V_{act}$, the voltage required to activate special mode circuit 20, is therefore equal to or greater than the preset threshold value plus the preset voltage value or $V_{dd}+V_T+(n)V_T$, where n is the number of series-connected transistors 62. Note that the preset threshold value, in itself, is enough to raise $V_{act}$ above the low voltage level range normally associated with binary logic values. Voltage reduction subcircuit 61 adds incremental voltage to the preset threshold value to create a significant margin between the low voltage level and the special high voltage level.

Preferably, the number n of the series connected transistors 62 in the voltage reduction subcircuit exceeds three and the preset voltage value is greater than the threshold value of the voltage detection subcircuit. For example, normally the threshold value of the voltage detection subcircuit will be approximately five to six volts. In such a case the preset voltage value should preferably exceed two to six volts. Preferably, $V_{act}$ should be eight volts or greater.

Active pullup subcircuit 69 is for maintaining the voltage of the reduced voltage input signal 72 above a minumum voltage, the minimum voltage being lower that the preset threshold value of the voltage detection subcircuit. Active pullup subcircuit 69 comprises semiconductor diode means for unidirectionally conducting from a positive reference voltage $V_{dd}$ to the reduced voltage input signal 72. Specifically, the semiconductor diode means comprises an n-channel MOSFET 70 having a gate and drain connected to $V_{dd}$ and a source connected to reduced voltage input signal 72. Transistor 70 insures that reduced voltage input signal 72 will be maintained at a minimum voltage equal to $V_{dd}-V_{T70}$, where $V_{T70}$ is the threshold voltage of transistor 70. Note that it might be desirable in some instances to use two or more similarly connected transistors 70, in series with each other, to maintain reduced voltage input signal 72 at a relatively lower minimum voltage and to insure that the minimum voltage is sufficiently lower than the preset threshold value.

Figure 2:
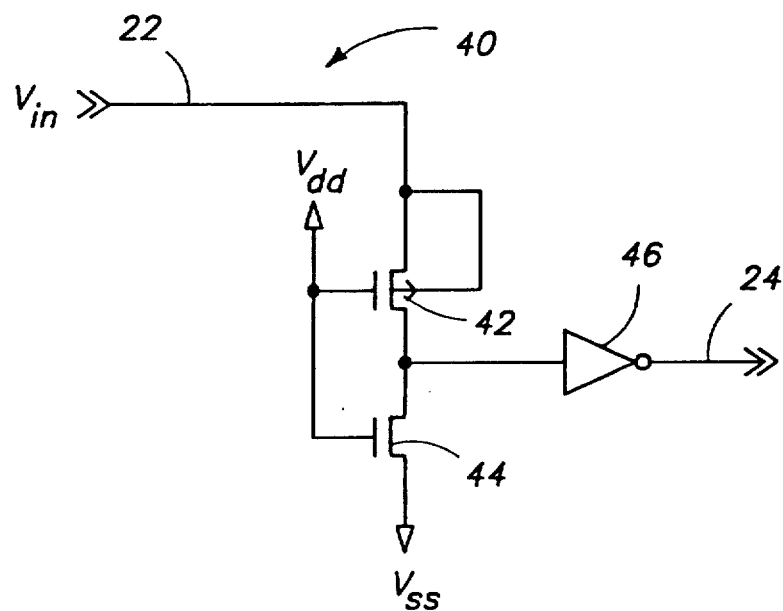
FIG. 2 is an electrical schematic diagram of a first prior art special mode activation circuit.
Figure 3:
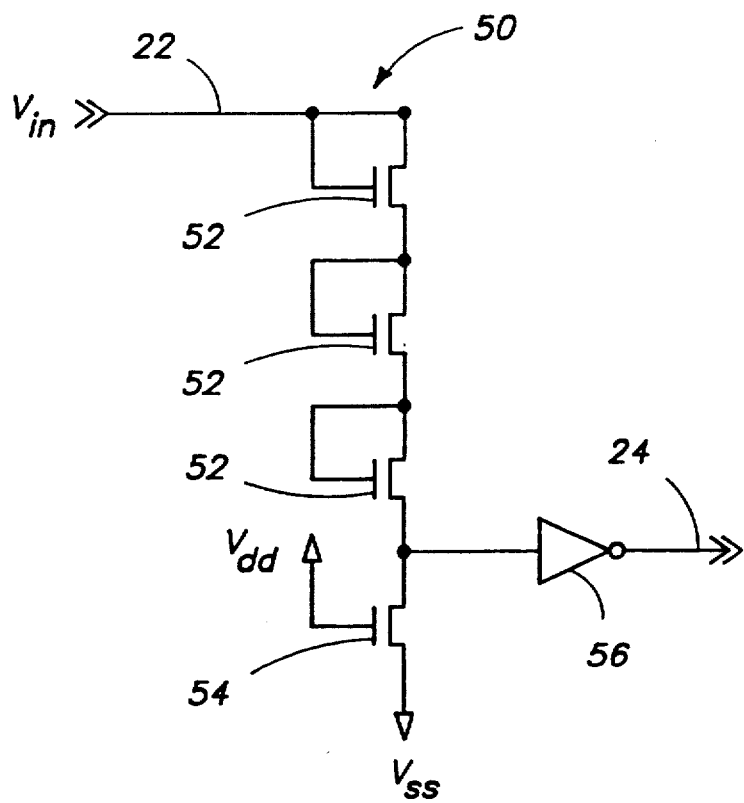
FIG. 3 is an electrical schematic diagram of a second prior art special mode activation circuit.

The circuit of FIG. 4 is advantageous over the circuits of FIGS. 2 and 3 and over other prior art circuits in that it presents a very high impedance to input line 22. Specifically, voltage detection subcircuit 64 requires no current until reduced voltage input signal 72 exceeds the preset threshold value, $V_{dd}+V_T$, or until $V_{in}$ reaches $V_{act}$. In addition, active pullup subcircuit 69 prevents reduced voltage input signal 72 from drifting to a low voltage (in relation to the normally present low voltage level signals at input line 22) that would forward bias transistors 62. Such forward biasing could result in current leakage through voltage reduction subcircuit 61.

Further, an input signal at input terminal 12 is never required to raise the voltage of reduced voltage input signal 72 from ground, since active pullup subcircuit 64 maintains reduced voltage input signal 72 at a minimum voltage near $V_{dd}$ to prevent latchup. Because of the small voltage change required in the reduced voltage input signal 72, only minimal current is required to raise reduced voltage input signal 72 to the preset threshold value and to activate special mode circuit 20.

Another advantage of special mode activation circuit 60 is that $V_{act}$, the voltage required at input terminal 12 to activate special mode circuit 20, is predictable and is insensitive to process variations. $V_{act}$ varies directly with $V_{dd}$, and can be simply specified as a fixed voltage above $V_{dd}$.

In compliance with the statue, the invention has been described in language more or less specific as to structural features. It is to be understood, however, that the invention is not limited to the specific features shown, since the means and construction herein disclosed comprise a preferred form of putting the invention into effect. The invention is, therefore, claimed in any of its forms or modifications within the proper scope of the appended claims appropriately interpreted in accordance with the doctrine of equivalents.

We claim:

1. In a semiconductor integrated circuit device having both an operational circuit and a normally deactivated special mode circuit connected in common to an input terminal to receive an input signal normally of low voltage level associated with binary logic values that is processed by the operational circuit, a special mode activation circuit operatively connected to the input terminal and the special mode circuit for maintaining the special mode circuit deactivated when the input signal is of the low voltage level and for activating the special mode circuit when the input signal is changed to a special high voltage level, said special mode activation circuit comprising:

a voltage reduction subcircuit for reducing the voltage of the input signal by a preset voltage value to generate a reduced voltage input signal;

a voltage detection subcircuit operatively connected to the special mode circuit and responsive to the reduced voltage input signal for preventing activation of the special mode circuit when the voltage of the reduced voltage input signal is less than a preset threshold value and for activating the special mode circuit when the voltage of the reduced voltage input signal exceeds the preset threshold value;

an active pullup subcircuit which maintains the voltage of the reduced voltage input signal above a minimum voltage, the minimum voltage being below the preset thresold value; and wherein the sum of the preset voltage value of the voltage reduction subcircuit and the preset threshold value of the voltage detection subcircuit is substantially greater than the low voltage level normally associated with binary logic values, in which the special high voltage level input signal must be equal to or greater than such sum in order to activate the special mode circuit.

2. In the semiconductor integrated circuit device of claim 1, wherein the preset threshold value exceeds the voltage normally associated with binary logic values.

3. In the semiconductor integrated circuit device of claim 1, wherein the voltage detection subcircuit operates from a postive supply voltage and the preset threshold value exceeds the positive supply voltage by a fixed value.

4. In the semiconductor integrated circuit device of claim 1, wherein the preset threhold value exceeds the voltage normally associated with binary logic values.

5. In the semiconductor integrated circuit device of claim 1 wherein the active pullup subcircuit comprises a MOSFET transistor having a gate and drain connected to a voltage reference and a source connected to the reduced voltage signal.

6. In the semiconductor integrated circuit device of claim 1, wherein the voltage reduction subcircuit includes means for preventing reverse flow of current therethrough.

7. In the semiconductor integrated circuit device of claim 1 wherein the voltage reduction subcircuit includes a plurality of serially connected transistors configured to function as diodes for generating the reduced voltage input signal and for preventing reverse current therethrough.

8. In the semiconductor integrated circuit device of claim 7 wherein the voltage reduction subcircuit includes at least three serially connected diode-acting transistors for generating the reduced voltage input signal and for preventing reverse current therethrough.

9. In the semiconductor integrated circuit device of claim 7 wherein each of the series-connected diode-acting transistors drops an incremental voltage of between 0.3 volts and 1.0 volts inclusive.

10. In the semiconductor integrated circuit device of claim 1, the active pullup subcircuit comprising semiconductor diode means for unidirectionally conducting from a voltage reference to the reduced voltage signal.

11. In the semiconductor integrated circuit device of claim 1 wherein the sum of the preset voltage value of the voltage reduction subcircuit and the preset threshold value of the voltage detection subcircuit is greater than twice the low level voltage normally associated with binary logic values.

12. In the semiconductor intergrated circuit device of claim 1, wherein:

the voltage reduction subcircuit comprises a plurality of serially connected diode voltage reduction means for generating the reduced voltage input signal and for preventing reverse current therethrough;

the voltage detection subcircuit comprises first and second MOSFET transistors, the first and second transistors having sources connected in common to form an activation line, each transistor having a gate connected to a voltage reference, the second transistor having a drain connected to ground, and the first transistors having a drain connected to the reduced voltage input signal, the transistors being adapted to activate the special mode circuit through the activation line when the reduced voltage input signal exceeds the preset threshold value, the preset threhold value being approximately equal to the voltage reference plus the threshold voltage of the first transistor.

13. In the semiconductor integrated circuit device of claim 12, each diode voltage reduction means comprising a MOSFET transistor having a source, a drain, and a gate, wherein the drain and gate are connected in common to prevent reverse current from the source to the drain and wherein forward current from the drain to the source flows only when the drain has a voltage with respect to the source which exceeds the transistor threshold voltage.

14. In the semiconductor integrated circuit device of claim 12 wherein the active pullup subcircuit comprises a MOSFET transistor connected between a voltage reference and the reduced voltage signal.

15. In the semiconductor integrated circuit device of claim 12 wherein the active pullup subcircuit comprises semiconductor diode means for unidirectionally conducting from a voltage reference to the reduced voltage signal.

16. In the semiconductor integrated circuit device of claim 12 wherein the active pullup subcircuit comprises a MOSFET transistor having a gate and drain connected to a voltage reference and a source connected to the reduced voltage signal.

17. In the semiconductor integrated circuit device of claim 1 wherein the active pullup subcircuit comprises a MOSFET transistor connected between a voltage reference and the reduced voltage signal.

* * * * *